United States Patent

[11] 3,564,296

[72] Inventor Jackson Lum
Bayside, N.Y.
[21] Appl. No. 746,228
[22] Filed July 19, 1968
[45] Patented Feb. 16, 1971
[73] Assignee Sylvania Electric Products, Inc.

[54] WAVEFORM SHAPING CIRCUIT COMPRISING A UNIJUNCTION TRANSISTOR AND ZENER DIODE
8 Claims, 5 Drawing Figs.

[52] U.S. Cl. ........................................ 307/261,
307/263, 307/264, 307/268, 307/283, 307/301
[51] Int. Cl. ........................................ H03k 5/00
[50] Field of Search ........................................ 307/246, 237, 261, 263, 264, 268, 283, 301; 328/28, 36

[56] References Cited
UNITED STATES PATENTS
3,202,937 8/1965 Anderson .................... 307/301X

*Primary Examiner*—Stanley D. Miller, Jr.
*Attorneys*—Robert J. Frank and Joseph H. Roediger

ABSTRACT: A circuit for converting an input voltage waveform having a magnitude which varies slowly with time to a substantially rectangular voltage pulse having a steep leading edge. The output pulse is initiated when the input voltage falls below a first predetermined magnitude and is terminated when the input voltage increases above a second predetermined magnitude. In one embodiment, the input voltage is applied between the two base terminals of a unijunction transistor and the output pulse obtained across a capacitor connected between the emitter terminal and one of the base terminals of the transistor. A Zener diode is coupled between the emitter and the other base terminal of the transistor.

INVENTOR.
JACKSON LUM
BY R. J. Frank
ATTORNEY.

PATENTED FEB 16 1971 3,564,296

INVENTOR.
JACKSON LUM
BY R. J. Frank
ATTORNEY.

WAVEFORM SHAPING CIRCUIT COMPRISING A UNIJUNCTION TRANSISTOR AND ZENER DIODE

BACKGROUND OF THE INVENTION

This invention relates to waveform-shaping circuits and in particular to circuits for converting an input voltage waveform having a magnitude which varies slowly with time into a voltage pulse having a steep-leading edge.

Many electronic systems used for communications, control and other applications require circuits which can convert a sinusoidal or other smoothly varying voltage into a substantially rectangular voltage pulse. Conventionally, this function is performed by employing a Schmitt trigger circuit, limiter or one of a number of multivibrator configurations suitable for this purpose. It is characteristic of these circuits that, if they are to provide a sharp-leading edge (for example, having a rise time of the order of 0.1 microsecond) a relatively large number of components must be used. Two or more transistors, several resistors and capacitors and, in some cases, one or more diodes are normally found in these circuits.

It is an object of my invention to provide a circuit having a relatively small number of components which accepts an input voltage having a magnitude that changes slowly with time (such as a sine wave) and converts it to a voltage pulse having a steep-leading edge. More specifically, a preferred embodiment of my invention employs only one transistor, one zener diode, one capacitor and two resistors.

SUMMARY OF THE INVENTION

The present invention comprises a first control element having first, second and third terminals and a second control element having first and second terminals. The first control element is characterized by a high impedance between its second and third terminals when the voltage between the second and third terminals is less than a predetermined percentage of the voltage between the first and third terminals. Conversely, the impedance between the second and third terminals of the transistor is relatively low when the voltage between the second and third terminals exceeds the predetermined percentage of the voltage between the first and third terminals.

The second control element exhibits a high impedance between its first and second terminals when the voltage between the first and second terminals is of a given polarity and has a magnitude less than a predetermined value. The impedance between the first and second terminals is relatively low when the magnitude of the voltage thereacross exceeds the predetermined value.

A capacitive element is coupled between the second and third terminals of the first control element and a resistive element is connected in series with the second control element, the series-connected resistive and second control elements being coupled between the first and second terminals of the first control element.

In one embodiment of the invention, the first control element is a unijunction transistor. In accordance with conventional nomenclature, the first and third terminals of the unijunction transistor are termed the base-two and base-one terminals respectively and the second terminal is termed the emitter terminal. When the voltage $V_A$ at base-two with respect to base-one is positive and the voltage $V_E$ between the emitter and base-one is less than $\mu V_A$, where $\mu$ is termed the intrinsic standoff ratio of the transistor, there is substantially no emitter current. If $V_E$ becomes greater than $\mu V_A$, the emitter is forward biased and emitter current will flow resulting in a decrease in the impedance between the emitter and base-one of the transistor. As the emitter current increases, the emitter voltage $V_E$ decreases, the transistor going rapidly through a region wherein its dynamic resistance is negative to a saturation region in which the dynamic resistance is positive.

The second control element in the circuit is preferably a junction diode designed to effect nondestructive "breakdown" from a very high resistance to a very low resistance at a predetermined voltage level. This diode, which will be referred to hereinafter as a zener diode, is chosen such that its breakdown voltage $V_z$ is greater than the larger of $V_m\,(1-\mu)$ and $$\frac{V_m-\mu V_{sat}}{(1+\mu)}$$

where $V_m$ is the maximum value of the voltage $V_A$ applied to the circuit and $V_{sat}$ is the emitter saturation voltage of the unijunction transistor.

As the input voltage $V_A$ approaches $V_m$, the zener diode begins conducting thereby charging the capacitor connected between the emitter and base-one of the unijunction transistor. The impedance between the emitter and base-one of the transistor is high because the emitter to base-one voltage $V_E$ is less than $\mu V_m$. If the input voltage $V_A$ now decreases from $V_m$, the diode will stop conducting followed by a decrease in the emitter to base-one impedance as the voltage $\mu V_A$ falls below the emitter to base-one voltage. The flow of emitter current results in a rapid decrease in the emitter to base-one voltage generating the sharp leading edge of a pulse across the capacitor. The rate of voltage change at this edge is independent of the rate at which the magnitude of the input voltage changes. The voltage across the capacitor will remain constant until the input voltage $V_A$ rises to a magnitude sufficiently high to cause the diode to conduct. The capacitor voltage then increases at a rate determined primarily by the rate of change of the input voltage.

A second resistor may be coupled between the diode first resistor junction and the base-one electrode of the transistor to provide a path for the flow of leakage current through the diode and the transistor. In addition, if an output consisting of sharp positive pulses is desired, it may be obtained from the voltage across a resistor inserted in series with the base-one terminal of the transistor. Similarly, sharp negative pulses can be obtained by taking the output across a resistor inserted in series with the capacitor.

DESCRIPTION OF THE PREFERRED EMBODIMENTS

Figure 1:
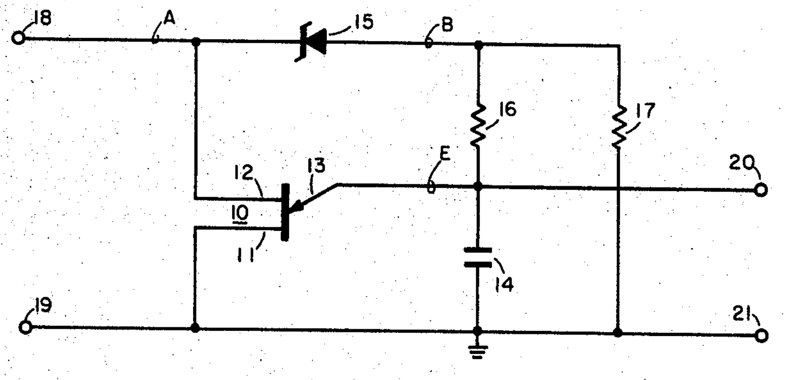
FIG. 1 is an electrical schematic diagram of one embodiment of the invention.

Referring to FIG. 1, there is shown a waveform shaping circuit comprising a unijunction transistor 10 having first and second base terminals 11 and 12 and an emitter terminal 13. A capacitor 14 is connected between the emitter 13 and base terminal 11. A zener diode 15 is connected in series with a first resistor 16, diode 15 and resistor 16 being connected between terminals 12 and 13 of transistor 10. A second resistor 17 is connected between the diode 15-resistor 16 junction and base terminal 11 of the transistor. Input terminals 18 and 19 are connected to base terminals 12 and 11 of transistor 10 and output terminals 20 and 21 to emitter terminal 13 and base terminal 11 of transistor 10 respectively. Terminals 19 and 21, base 11, capacitor 14 and resistor 17 are connected to a common grounded reference point. When the voltage at a point in the circuit such as A, B, or E is mentioned hereinafter it will be understood that this voltage is with respect to this common ground unless otherwise stated.

As previously mentioned, zener diode 15 has been selected so that its breakdown voltage $V_z$ is greater than the larger of $(1-\mu)\,V_m$ and $$\frac{V_m-\mu V}{(1+\mu)}$$

where $\mu$ is the intrinsic standoff ratio of unijunction transistor 10, $V$m is the maximum value of the voltage applied across input terminals 18 and 19 and $V_{sat}$ is the emitter saturation voltage of the unijunction transistor.

Figure 2A:
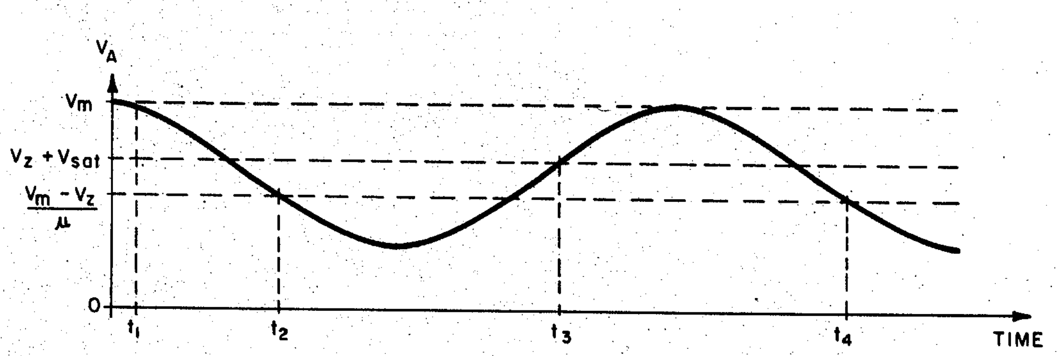
FIGS. 2*a* and 2*b* are idealized input and output voltage waveforms illustrating the operation of the waveform shaping circuit.
Figure 2B:
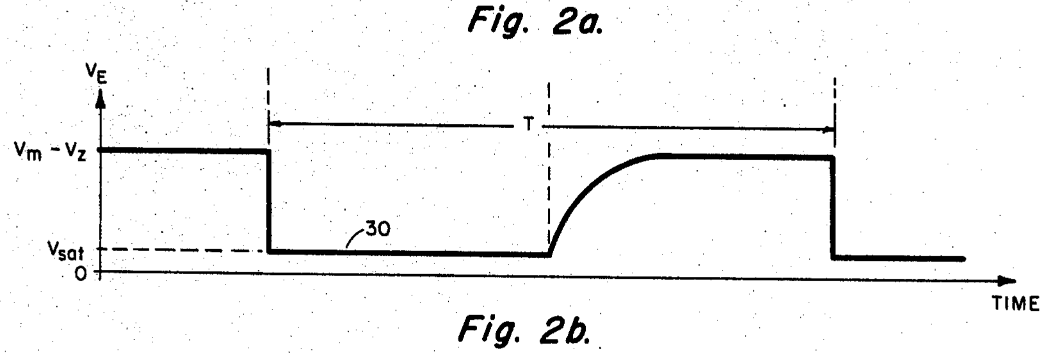

In FIG. 2a there is shown a typical sinusoidal input voltage $V_A$, having an amplitude $V_m$ and a period $T$. While this voltage has been illustrated as a periodic sine wave, it should be understood that other waveforms may be used and that they may be aperiodic provided the time between output pulses (FIG. 2b) is sufficiently short to prevent excessive voltage drop across the capacitor during the interpulse interval.

At time $t = 0$, the magnitude of the input voltage $V_A$ is $V_m$, the voltage $V_{AB}$ across diode 15 is sufficiently large to cause it to conduct and capacitor 14 is fully charged. The voltage $V_E$ across capacitor 14 is equal to $V_m - V_z$ (see FIG. 2b), substantially no current flowing through resistor 16 once capacitor 14 has been fully charged. The impedance between terminals 13 and 11 of unijunction transistor 10 is high since the emitter voltage $V_E$ is less than $\mu V_m$; that is, the emitter voltage $V_E$ equals $V_m - V_z$ and is less than $V_m - V_m(1-\mu) = \mu V_m$ since the zener diode 15 has been selected to have a breakdown voltage $V_z$ which is greater than $V_m(1-\mu)$.

As the input voltage $V_A$ decreases below $V_m$, the voltage across diode 15 is reduced below $V_z$ causing the diode to stop conducting at $t = t_1$. The output voltage $V_E$ remains constant at $V_m - V_z$ since the charge on capacitor 14 does not change appreciably.

When the input voltage $V_A$ drops still further to a value below $$\frac{V_m - V_z}{\mu}$$

the output voltage $V_E$ is then greater than $\mu V_A$ and the emitter of unijunction transistor 10 becomes forward biased. Consequently, holes are injected into the transistor producing an equal increase in the number of electrons in the region between emitter 13 and base 11. This results in a decrease in the impedance between emitter 13 and base 11 so that, as the emitter current increases, the emitter voltage $V_E$ decreases. This change occurs abruptly as indicated at $t = t_2$ in FIG. 2. The sudden decrease in the impedance between emitter 13 and base 11 permits capacitor 14 to discharge through the emitter-base path and the voltage across it drops to a value substantially equal to the saturation voltage $V_{sat}$ of the unijunction transistor 10. The emitter 13-base 11 path of transistor 10 then reverts to its high impedance state since $V_E = V_{sat}$ is much less than $\mu V_A$. In order to obtain a flat bottomed pulse as shown at 30 in FIG. 2b, it is necessary to choose $V_z$ greater than $$\frac{V_m - V_{sat}}{1+\mu}$$

When the applied voltage $V_A$ increases to a magnitude $V_z + V_{sat}$ as shown at $t_3$, diode 15 again conducts and capacitor 14 is charged at a rate determined primarily by the rate of change of the applied voltage $V_A$. This cycle is repeated each time the input voltage drops below $$\frac{V_m - V_z}{\mu}$$

and subsequently increases above $V_z + V_{sat}$.

The value of resistor 16 should be chosen as low as possible but should be high enough to prevent undue capacitive loading of the input voltage source by capacitor 14. The value of resistor 17 in ohms should be less than $$\frac{E - V_z}{I_r}$$

where $I_r$ is the total reverse leakage current through diode 15 and transistor 16.

In a typical circuit, the component values are as follows:

| | |
|---|---|
| Transistor 10 | Type 2N4853 |
| Capacitor 14 | 0.01 microfarad |
| Diode 15 | Type 1N960B |
| Resistor 16 | 1000 ohms |
| Resistor 17 | 1 megohm |

This circuit produces an output pulse having a 0.5 microsecond rise time at its leading edge (time $t_2$) with a sinusoidal input voltage having an amplitude $V_m$ of about 15 volts and a frequency of 1000 hertz.

Figure 3:
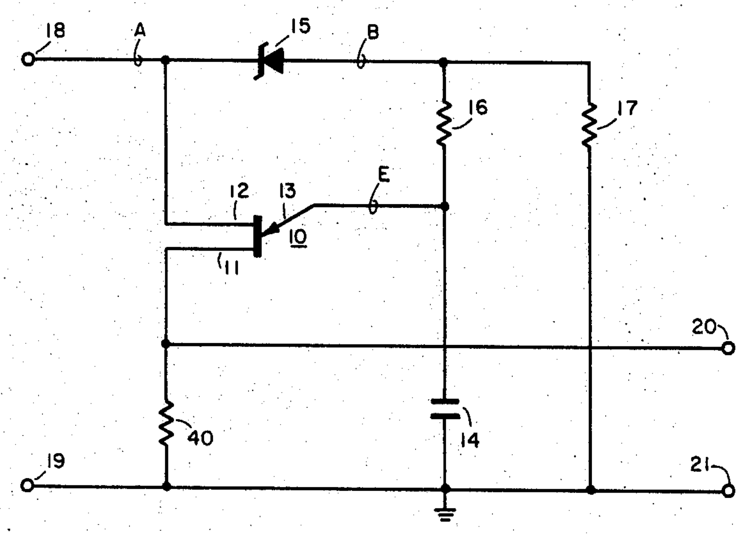
FIG. 3 is a schematic diagram of another embodiment of the invention.

FIG. 3 illustrates a modification of the circuit of FIG. 1 wherein a resistor 40 has been inserted in series with the base 11 lead of transistor 10. The output voltage measured across this resistor between terminals 20 and 21 is a sharp positive pulse occuring at time $t_2$ during the brief interval in which transistor 10 is conducting. A typical value for resistor 40 is 47 ohms.

Figure 4:
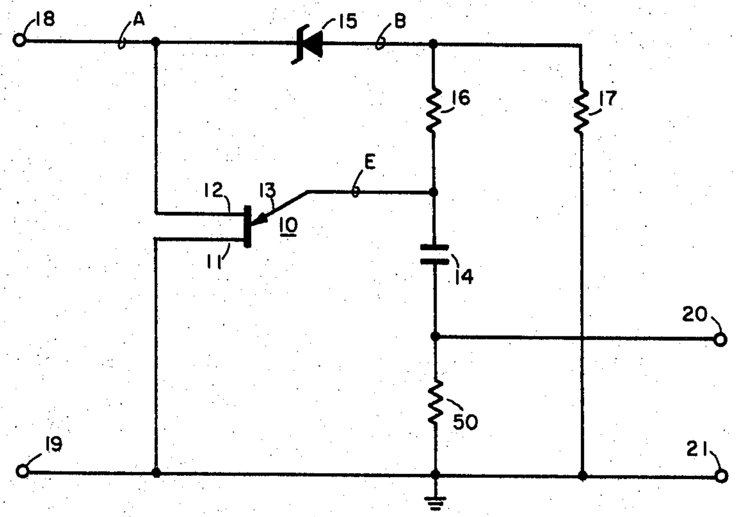
FIG. 4 is a schematic diagram of a third embodiment of the invention.

FIG. 4 shows another modification of the circuit in which a resistor 50 is placed in series with capacitor 14 to provide a a sharp negative pulse at time $t_2$. Resistor 50 would typically have a value of 100 ohms.

While I have shown and pointed out my invention as applied above, it will be apparent to those skilled in the art that many modifications can be made within the scope of my invention.

I claim:

1. A waveform-shaping circuit comprising:

a. input and output terminals;

b. a first control element having first, second and third terminals, said first and second terminals being coupled to said input and output terminals respectively, the impedance between the second and third terminals of said first control element being relatively low when the voltage between said second and third terminals exceeds said predetermined percentage of the voltage between said first and third terminals;

c. a capacitive element coupled between the second and third terminals of the first control element;

d. a second control element having a first terminal coupled to said input terminal and a second terminal; the impedance between the first and second terminals of said second control element being relatively high when said first terminal is positive with respect to said second terminal and of a magnitude which is less than a predetermined value, the impedance between said first and second terminals being relatively low when the magnitude of the voltage thereacross exceeds said predetermined value; and e. a resistive element, said resistive element being coupled between the second terminal of said second control element and the second terminal of said first control element, a pulse being generated between the second and third terminals of said first control element when said predetermined percentage of the voltage between the first and third terminals of said first control element is less than the voltage between said second and third terminals of said first control element.

2. The waveform-shaping circuit defined by claim 1 wherein said first control element is a unijunction transistor, the first and third terminals of said first control element being the base terminals of said transistor and the second terminal being the emitter terminal thereof.

3. The waveform-shaping circuit defined by claim 1 wherein said second control element is a zener diode.

4. The waveform-shaping circuit defined by claim 1 wherein one end of a second resistive element is coupled to the junction of said second control element and said first resistive element and the other end is coupled to the third terminal of said first control element.

5. A waveform-shaping circuit comprising:

a. input and output terminals;

b. a unijunction transistor having first and second base terminals and an emitter terminal, said second base and emitter terminals being coupled to said input and output terminals respectively, the impedance between the emitter and first base terminals of said transistor being relatively high when the voltage between said emitter and first base terminals is less than a predetermined percentage of the voltage between said first and second base terminals, and relatively low when the voltage between said emitter and first base terminals exceeds said predetermined percentage of the voltage between said first and second base terminals;

c. a capacitor coupled between the emitter and first base terminals of said transistor;

d. a zener diode having a first terminal coupled to said input terminal and a second terminal, the impedance between said first and second terminals of said zener diode being relatively high when said first terminal is positive with respect to said second terminal and of a magnitude which is less than a predetermined value, the impedance between said first and second terminals being relatively low when the magnitude of the voltage thereacross exceeds said predetermined value;

e. a first resistor, said first resistor being coupled between the second terminal of said zener diode and the emitter terminal of said transistor; and f. a second resistor coupled between the junction of said zener diode and first resistor and the first base of said transistor, a pulse being generated between the emitter and first base terminals of said transistor when said predetermined percentage of the voltage between the first and second base terminals of said transistor is less than the voltage between said emitter and first base terminals of said transistor.

6. The waveform-shaping circuit defined by claim 5 wherein the breakdown voltage of said zener diode is greater than the larger of $V_m(1-\mu)$ and $$\frac{V_m-\mu V_{sat}}{1+\mu}$$

, where $V_m$ is the maximum voltage applied between the base terminals of said unijunction transistor, $\mu$ is the intrinsic standoff ratio of said transistor and $V_{sat}$ is the emitter saturation voltage of said transistor.

7. The waveform-shaping circuit defined by claim 5 wherein a third resistor is coupled in series with the first base terminal of said transistor.

8. The waveform-shaping circuit defined by claim 5 wherein a fourth resistor is coupled in series with said capacitor.